US012694930B2

(12) United States Patent
Kanj

(10) Patent No.: US 12,694,930 B2
(45) Date of Patent: Jul. 28, 2026

(54) MEMORY CELL NOISE PROTECTION VIA BIDIRECTIONAL THRESHOLD SWITCHING DEVICES

(71) Applicant: Synopsys, Inc., Sunnyvale, CA (US)

(72) Inventor: Rouwaida Kanj, Cedar Park, TX (US)

(73) Assignee: Synopsys, Inc., Sunnyvale, CA (US)

( * ) Notice: Subject to any disclaimer, the term of this patent is extended or adjusted under 35 U.S.C. 154(b) by 98 days.

(21) Appl. No.: 18/735,138

(22) Filed: Jun. 5, 2024

(65) Prior Publication Data

US 2025/0378874 A1     Dec. 11, 2025

(51) Int. Cl.
G11C 11/419 (2006.01)
G11C 11/418 (2006.01)

(52) U.S. Cl.
CPC .......... G11C 11/419 (2013.01); G11C 11/418 (2013.01)

(58) Field of Classification Search
CPC ............................ G11C 11/419; G11C 11/418
USPC ............................................ 365/189.011, 205
See application file for complete search history.

(56) References Cited

U.S. PATENT DOCUMENTS

| | | | | | |
|---|---|---|---|---|---|
| 4,864,544 | A | * | 9/1989 | Spak | G06F 7/78 365/189.12 |
| 5,349,242 | A | * | 9/1994 | Tanaka | H03K 17/567 327/482 |
| 5,764,079 | A | * | 6/1998 | Patel | H03K 19/1776 326/39 |
| 5,867,443 | A | * | 2/1999 | Linderman | G11C 11/412 365/228 |
| 7,675,371 | B2 | * | 3/2010 | Wood | H03K 3/0315 331/46 |
| 7,684,232 | B1 | | 3/2010 | Lesea | |
| 10,497,432 | B1 | * | 12/2019 | Lu | G11C 11/412 |
| 11,374,560 | B1 | * | 6/2022 | Rasmus | G11C 7/065 |
| 12,184,061 | B2 | * | 12/2024 | Zhang | H10D 89/911 |
| 2003/0189847 | A1 | | 10/2003 | Liu et al. | |

(Continued)

FOREIGN PATENT DOCUMENTS

CN            117674785 A        3/2024

OTHER PUBLICATIONS

Ming Wang et al., "Enhancing the Matrix Addressing of Flexible Sensory Arrays by a Highly Nonlinear Threshold Switch", Advanced Materials, VCH Publishers, DE, vol. 30, No. 33, Jul. 3, 2018, XP071872218, ISSN: 0935-9648, DOI: 10.1002/ADMA. 201802516.

(Continued)

*Primary Examiner* — Michael T Tran

(57)            ABSTRACT

A memory device may include first and second inverters cross-coupled in a feedback loop, a first access transistor for a first node of the feedback loop, a second access transistor for a second node of the feedback loop, where the first node and the second node are to store complementary binary data bit values, and a bidirectional threshold switching device in the feedback loop between an output of the second inverter and an input of the first inverter. An additional memory device may include first and second inverters cross-coupled in a feedback loop, a first access transistor for a first node of the feedback loop, a second access transistor for a second node of the feedback loop, where the first node and the second node are to store complementary binary data bit values, and a bidirectional threshold switching device between the first access transistor and the first node.

19 Claims, 7 Drawing Sheets

(56)                    References Cited

U.S. PATENT DOCUMENTS

| | | | | |
|---|---|---|---|---|
| 2005/0062500 | A1* | 3/2005 | George | H03K 19/01759 |
| | | | | 326/86 |
| 2007/0085585 | A1* | 4/2007 | Frederick | H03K 3/356008 |
| | | | | 327/218 |
| 2007/0103217 | A1* | 5/2007 | Frederick | H03K 3/356008 |
| | | | | 327/218 |
| 2007/0171713 | A1* | 7/2007 | Hunter | G11C 11/413 |
| | | | | 365/185.07 |
| 2011/0235448 | A1* | 9/2011 | Wu | G11C 11/413 |
| | | | | 365/207 |
| 2016/0294373 | A1* | 10/2016 | Grubelich | H03K 3/356017 |
| 2019/0229933 | A1* | 7/2019 | Li | G11C 29/52 |
| 2020/0321915 | A1* | 10/2020 | Tajalli | H03B 5/24 |
| 2021/0104268 | A1* | 4/2021 | Ioki | G11C 11/419 |
| 2021/0349689 | A1* | 11/2021 | Lu | G11C 5/02 |
| 2022/0020739 | A1* | 1/2022 | Morishita | H10D 89/921 |
| 2022/0122657 | A1* | 4/2022 | Dhori | G11C 11/419 |
| 2022/0216220 | A1* | 7/2022 | Lee | H10B 10/12 |
| 2022/0302943 | A1* | 9/2022 | Bandi | H04L 25/03318 |
| 2022/0384609 | A1* | 12/2022 | Lin | H10D 64/018 |
| 2023/0170690 | A1* | 6/2023 | Zhang | H10D 89/811 |

OTHER PUBLICATIONS

International Search Report and Written Opinion, PCT/US2025/032349, Nov. 18, 2025, 10 pages.

\* cited by examiner

300

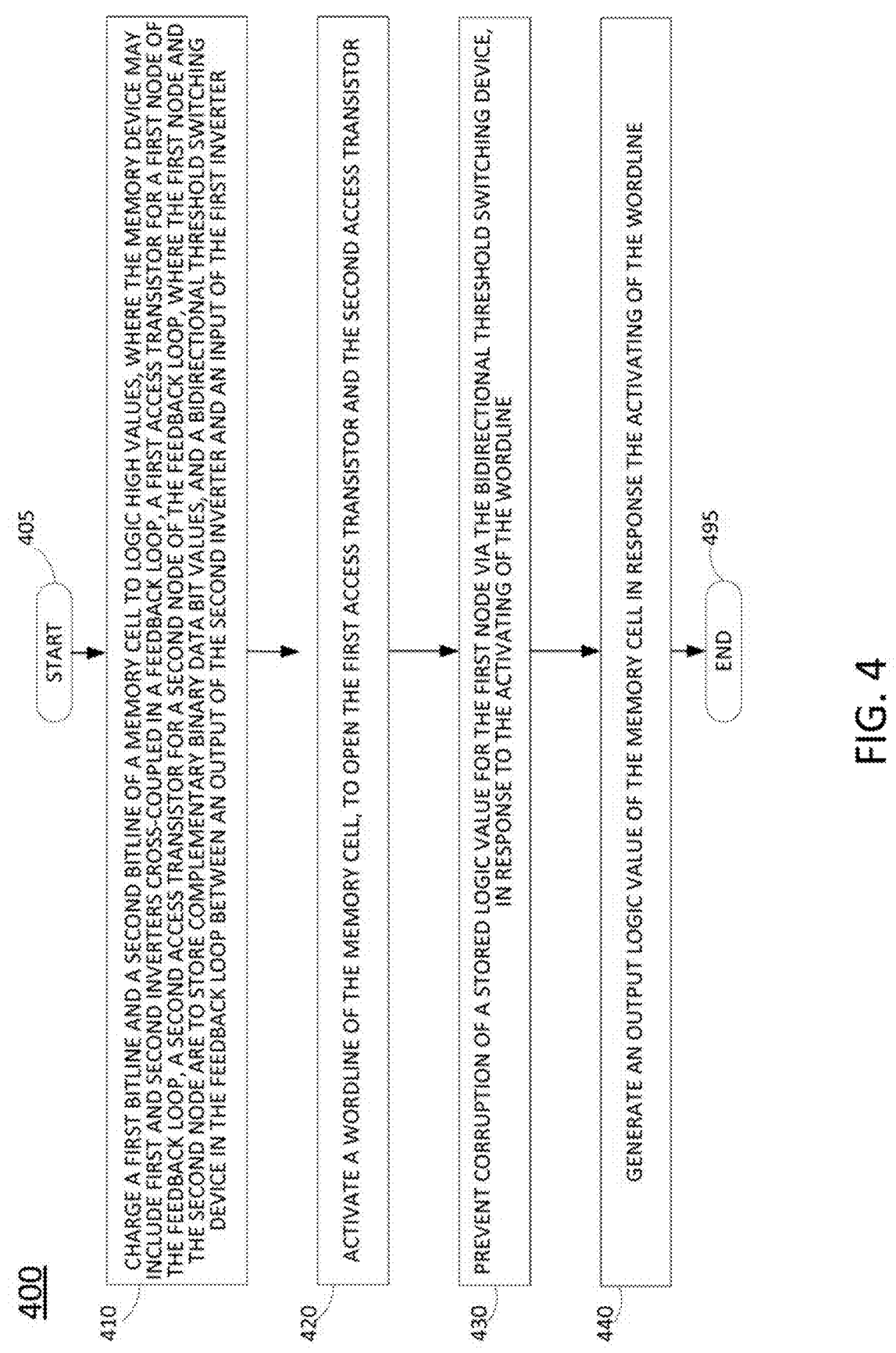

400

START — 405

410 — CHARGE A FIRST BITLINE AND A SECOND BITLINE OF A MEMORY CELL TO LOGIC HIGH VALUES, WHERE THE MEMORY DEVICE MAY INCLUDE FIRST AND SECOND INVERTERS CROSS-COUPLED IN A FEEDBACK LOOP, A FIRST ACCESS TRANSISTOR FOR A FIRST NODE OF THE FEEDBACK LOOP, A SECOND ACCESS TRANSISTOR FOR A SECOND NODE OF THE FEEDBACK LOOP, WHERE THE FIRST NODE AND THE SECOND NODE ARE TO STORE COMPLEMENTARY BINARY DATA BIT VALUES, AND A BIDIRECTIONAL THRESHOLD SWITCHING DEVICE IN THE FEEDBACK LOOP BETWEEN AN OUTPUT OF THE SECOND INVERTER AND AN INPUT OF THE FIRST INVERTER

420 — ACTIVATE A WORDLINE OF THE MEMORY CELL, TO OPEN THE FIRST ACCESS TRANSISTOR AND THE SECOND ACCESS TRANSISTOR

430 — PREVENT CORRUPTION OF A STORED LOGIC VALUE FOR THE FIRST NODE VIA THE BIDIRECTIONAL THRESHOLD SWITCHING DEVICE, IN RESPONSE TO THE ACTIVATING OF THE WORDLINE

440 — GENERATE AN OUTPUT LOGIC VALUE OF THE MEMORY CELL IN RESPONSE THE ACTIVATING OF THE WORDLINE

END — 495

FIG. 4

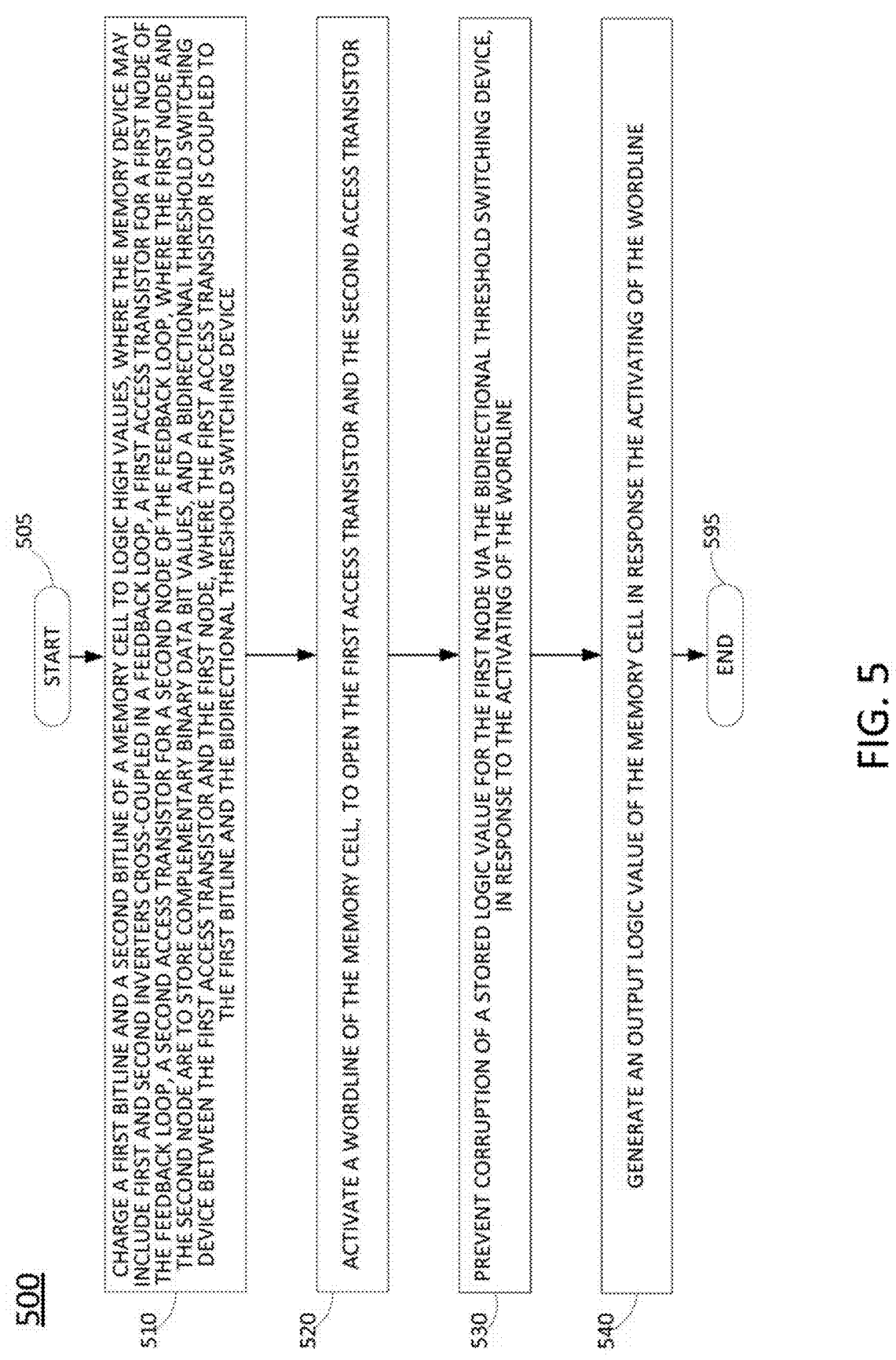

500

START
505

CHARGE A FIRST BITLINE AND A SECOND BITLINE OF A MEMORY CELL TO LOGIC HIGH VALUES, WHERE THE MEMORY DEVICE MAY INCLUDE FIRST AND SECOND INVERTERS CROSS-COUPLED IN A FEEDBACK LOOP, A FIRST ACCESS TRANSISTOR FOR A FIRST NODE OF THE FEEDBACK LOOP, A SECOND ACCESS TRANSISTOR FOR A SECOND NODE OF THE FEEDBACK LOOP, WHERE THE FIRST NODE AND THE SECOND NODE ARE TO STORE COMPLEMENTARY BINARY DATA BIT VALUES, AND A BIDIRECTIONAL THRESHOLD SWITCHING DEVICE BETWEEN THE FIRST ACCESS TRANSISTOR AND THE FIRST NODE, WHERE THE FIRST ACCESS TRANSISTOR IS COUPLED TO THE FIRST BITLINE AND THE BIDIRECTIONAL THRESHOLD SWITCHING DEVICE

510

ACTIVATE A WORDLINE OF THE MEMORY CELL, TO OPEN THE FIRST ACCESS TRANSISTOR AND THE SECOND ACCESS TRANSISTOR

520

PREVENT CORRUPTION OF A STORED LOGIC VALUE FOR THE FIRST NODE VIA THE BIDIRECTIONAL THRESHOLD SWITCHING DEVICE, IN RESPONSE TO THE ACTIVATING OF THE WORDLINE

530

GENERATE AN OUTPUT LOGIC VALUE OF THE MEMORY CELL IN RESPONSE THE ACTIVATING OF THE WORDLINE

540

END
595

FIG. 5

MEMORY CELL NOISE PROTECTION VIA BIDIRECTIONAL THRESHOLD SWITCHING DEVICES

TECHNICAL FIELD

The present disclosure relates to integrated circuit memory cells, and more particularly to memory cells with bidirectional threshold switching components to prevent corruption of stored logic values.

BACKGROUND

In fabrication of integrated circuit memories, process variations affect the design yield. Memory cells, such as static random access memory (SRAM) cells, use some of the smallest components on the chip and may suffer more from process variations than other integrated circuit elements. In a six transistor (6T) SRAM cell, the stored logic value is read via pass-gates, and a sense-amplifier measures a differential voltage that develops across cell bitlines. During a read operation, the cell nodes may be disturbed, and depending on the stored logic value and process variations, the cell may be more susceptible to such disturbances. This may affect the cell stability and potentially result in the cell flipping its value, thereby resulting in stability yield loss.

BRIEF DESCRIPTION OF THE DRAWINGS

The present disclosure will be understood more fully from the detailed description given below and from the accompanying figures of embodiments of the present disclosure. The figures are used to provide knowledge and understanding of embodiments of the present disclosure and do not limit the scope of the present disclosure to these specific embodiments. Furthermore, the figures are not necessarily drawn to scale.

FIG. 4 illustrates a flowchart of an example method for preventing corruption of a stored logic value for at least one node of a memory cell via at least one bidirectional threshold switching device, e.g., where the at least one bidirectional threshold switching device is in an inverter feedback loop of the memory cell, in accordance with the present disclosure.

FIG. 5 illustrates a flowchart of an additional example method for preventing corruption of a stored logic value for at least one node of a memory cell via at least one bidirectional threshold switching device, e.g., where the at least one bidirectional threshold switching device is between a first access transistor and a first node of the memory cell, in accordance with the present disclosure.

DETAILED DESCRIPTION

Figure 1:
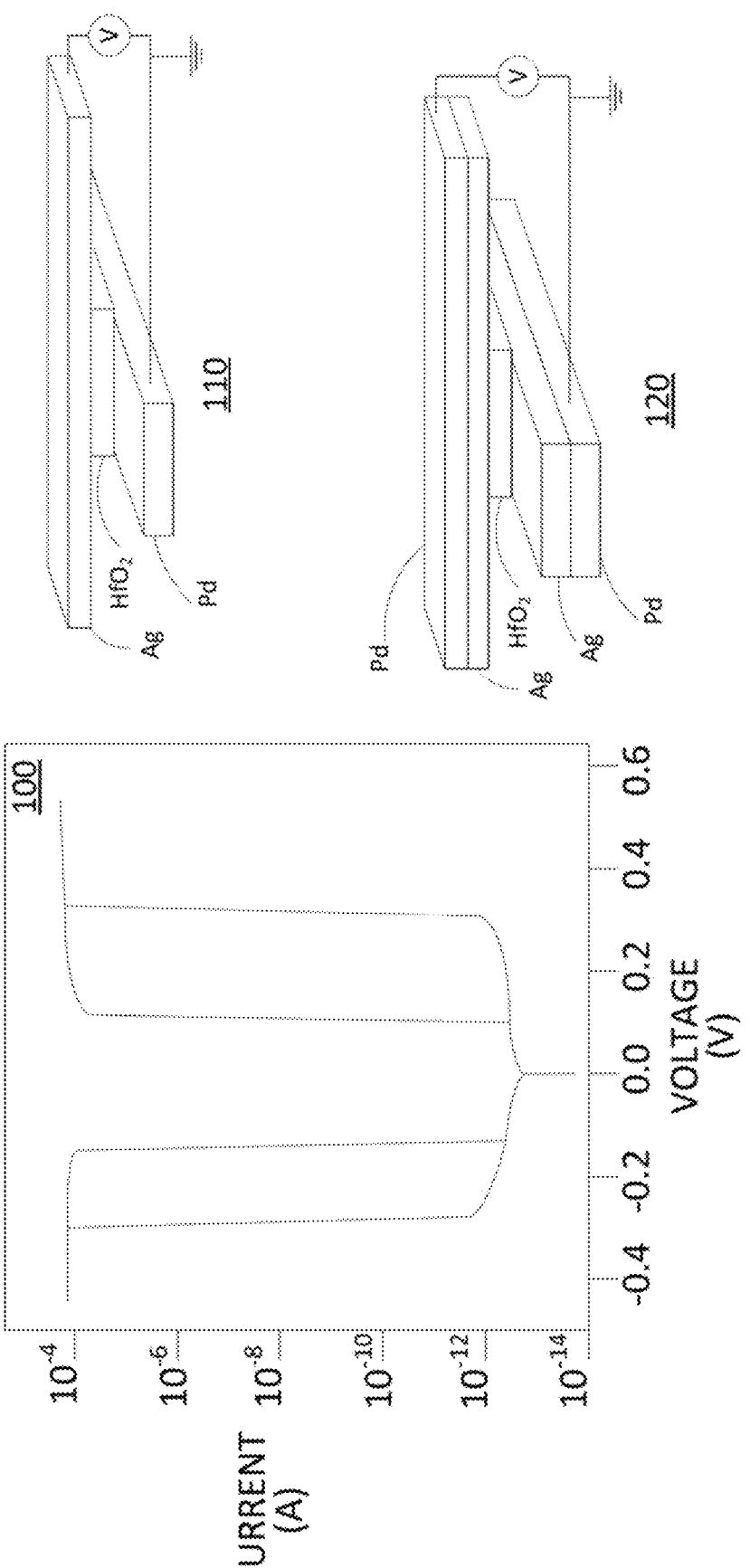
FIG. 1 illustrates example threshold switching devices, e.g., an example asymmetric threshold switching device and an example symmetric bidirectional threshold switching device.

Aspects of the present disclosure relate to memory cells with bidirectional threshold switching components to prevent corruption of stored logic values. In particular, examples of the present disclosure provide a memory cell with one or more bidirectional threshold switching devices for enhanced stability. For instance, examples of the present disclosure may relate to a six transistor (6T) SRAM cell, or variations thereof, such as a multi-port SRAM cell. In one example, the bidirectional threshold switching devices may be in series with the feedback loop between the output of one inverter and the input of another. In such an example, cell storage nodes may be read, while protecting the input of the inverter driving the storage node from read noise or other disturbances via one or more bidirectional threshold switching devices. In such an example, the read pass-gates may be connected to the storage nodes (the outputs of the inverters), and the write pass-gates may be connected to the inputs of the inverters. In another example, the bidirectional threshold switching devices may be connected between the storage nodes and the read pass-gates, while the write pass-gates may be connected to the storage nodes directly. In such an example, cell storage nodes may be read, while being protected from read noise or other disturbances via one or more bidirectional switches between the read component(s) (e.g., a sense amplifier connected to the memory cell bitlines, or the like) and the cell storage node(s). In both examples, the write port, or both the read/write ports can be used for write operations.

Technical advantages of the present disclosure include, but are not limited to enabling a read of memory cell storage nodes with reduced risk from read disturb noise (or other noises), e.g., a reduced risk of the cell flipping stored logic value(s). Examples of the present disclosure also provide an improved integrated circuit, e.g., a memory device implementing various aspects described herein. For instance, a memory device of the present disclosure may provide noise protection with reduced footprint or area, e.g., as compared to a hardened memory device with a full complement of backup/redundant memory cells, or the like. Examples of the present disclosure also provide an improved computing device or system implementing various aspects described herein. For instance, a computing device including a memory cell of the present disclosure may be fabricated in a smaller form factor, e.g., compared to a computing device that may use a memory component with redundant/backup memory cells, or the like. In addition, such a computing device may complete operations faster/in fewer clock cycles compared to memory components that do not include aspects of the present disclosure. For example, with fewer instances of memory cell corruption, such a computing device may avoid additional operations to recover one or more affected memory cell values. These and other aspects of the present disclosure are discussed in greater detail below in connection with the examples of FIGS. 1-7.

It is noted that a one-directional switch does not turn on until the voltage across the switch reaches a threshold voltage (VTH). The switch, thus is protected from noise until a voltage equal to VTH builds across the device. The switch turns off when the voltage across the device reaches a hold voltage (VIH), e.g., a low cutoff threshold. A bidirectional threshold switching device behaves like two backto-back one-directional switches. For instance, bidirectional threshold switching devices may be characterized by a high switching threshold (VTH), a low hold voltage (VIH), and a steep turn-on, in addition to being bidirectional (e.g., exhibiting a VTH and VIH for both positive and negative voltage differentials). An example, bidirectional threshold switching device may be silver and hafnium oxide-based (or variants thereof, e.g., $HfO_x$), which may also be referred to as a silver/hafnia-based selector. For instance, asymmetric and symmetric metal-insulator-metal structures have been demonstrated to exhibit these properties, such as an asymmetric structure of palladium/hafnium oxide/silver layers, or a symmetric structure of palladium/silver/hafnium oxide/sliver/palladium layers. For instance, FIG. 1 illustrates a first example threshold switching device 110 having an asymmetric structure including layers of silver, hafnium oxide, and palladium, and a second example bidirectional threshold switching device 120 having a symmetric structure including layers of palladium, silver, hafnium oxide, silver, and palladium. Such devices may exhibit a steep subthreshold swing as a conductive path forms or disappears based on the voltage across the device in response to powering on or off. The bidirectional switching characteristics may be summarized as in graph 100 of FIG. 1, which illustrates current response to voltages across an example bidirectional threshold switching device. In particular, a positive VTH is shown around 0.3 V and a positive VIH is shown around 0.1 V. Similarly, a negative VTH is shown around –0.3 V and a negative VIH is shown around –0.1 V.

Other bidirectional threshold switching devices may be copper-based or other metal-based, or may use a different ferroelectric oxide or other materials, such as strontium titanate ($SrTiO_3$), zirconium dioxide ($ZrO_2$), and so forth. It should also be noted that examples of the present disclosure may utilize developments of these types of bidirectional threshold switching device to provide a memory cell design with enhanced cell stability. For instance, bidirectional threshold switching devices of the present disclosure may be extended to include voltage controlled switches where the characteristics (VTH and VIH for both positive and negative voltages) may vary, e.g., based on a switch control voltage, or the like. In other words, such a bidirectional threshold switching device may have tunable characteristics/thresholds. Alternatively, or in addition, a bidirectional threshold switching device can be engineered to have a VTH high enough to block noise, but less than the target operating supply voltage VDD. Such a bidirectional threshold switching device may turn on strongly when the voltage potential builds up to exceed VTH (steep switching curve). Conversely, such a bidirectional threshold switching device prevents the flow of current in response to lesser voltages (e.g., read disturb noise or other noises).

Figure 2:
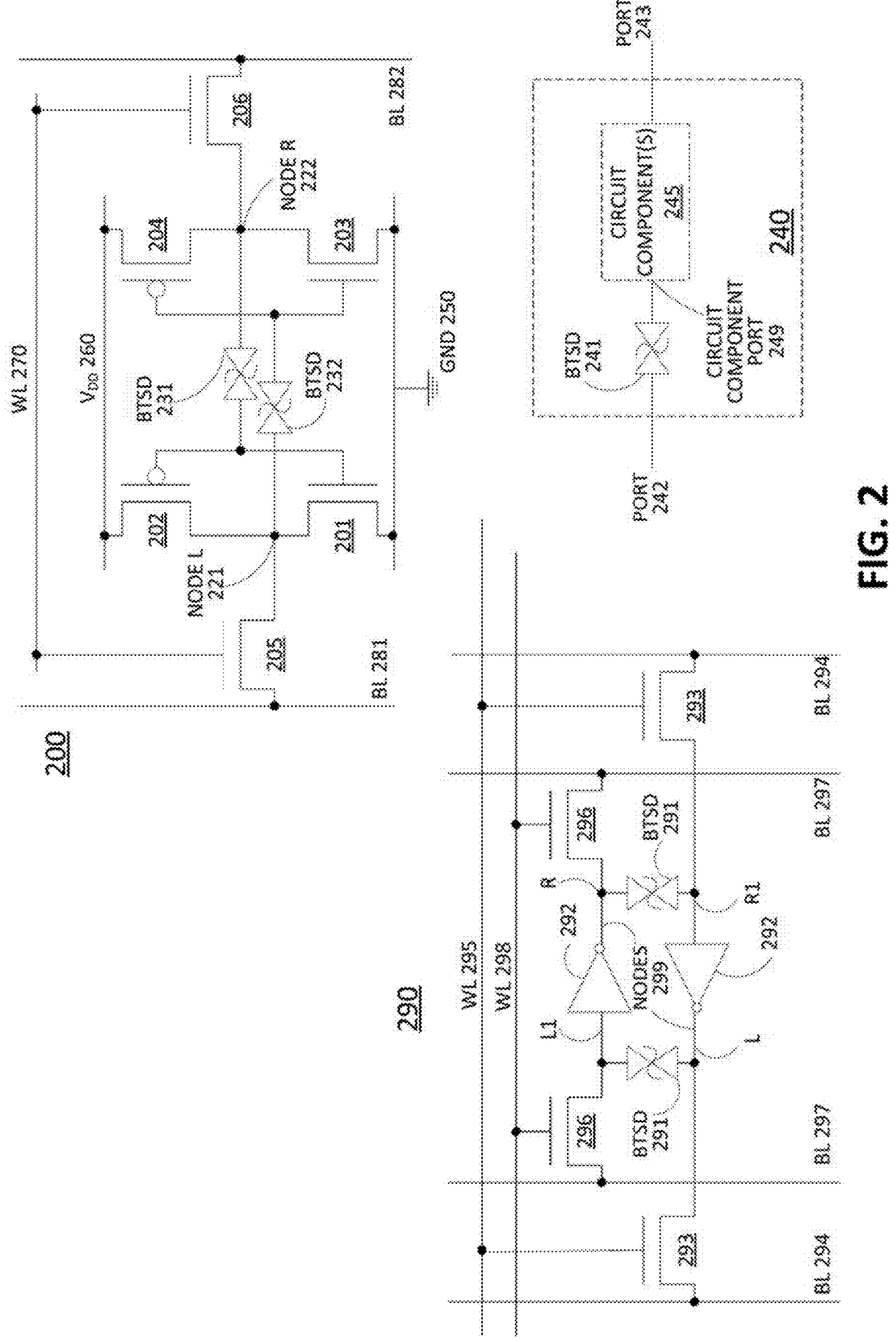
FIG. 2 illustrates example memory cells including bidirectional threshold switching devices in an inverter feedback loop, in accordance with the present disclosure.

To further aid in understanding the present disclosure, FIG. 2 illustrates a first example memory cell 200. The memory cell 200 may be a 6T design having two inverters and two read-write gates (pass gate transistors for read and write). For instance, n-type transistor 201 and p-type transistor 202 may form a first inverter, while n-type transistor 203 and p-type transistor 204 may form a second inverter. The n-type transistors 205 and 206 may be used for read and write operations via wordline 270 and bitlines 281 and 282. The inverters are connected to ground (VSS) 250 and a supply voltage (VDD) 260. It should be noted that by convention, the memory cell 200 may be set to read node L (221) as the stored logic value, or the node R (222) as the stored logic value. However, since these nodes store complementary values, the stored logic value may be read from either side, or from both sides (e.g., using a sense amplifier that senses positive and negative voltage differentials). As noted above, in one example, one or more bidirectional threshold switching devices (BTSDs) 231 and 232 may be included in the inverter feedback loop. For instance, BTSD 231 is situated between the output of the second inverter (node R (222)) and the input of the first inverter (e.g., connected to the gates of the transistors 201 and 202). Similarly, BTSD 232 is situated between the output of the first inverter (node L (221)) and the input of the first inverter (e.g., connected to the gates of the transistors 203 and 204).

It should be noted that throughout the present disclosure, a supply voltage VDD may alternatively or additionally be referred to as logic high, a logic high value, or "1." Similarly, a logic low/0 may correspond to ground (GND) and/or a negative supply voltage VSS. It should also be noted that although examples are described herein primarily in connection with complementary metal-oxide-semiconductor (CMOS) circuits including PMOS and NMOS transistors, in other, further, and different examples, other similar transistor types may be used, such as PNP bipolar junction transistors, NPN bipolar junction transistors, tunnel field-effect transistors (TFETs), heterojunction TFETs, fin field-effect transistors (FinFETs), and so forth.

To perform a dynamic read operation, the bitlines 281 and 282 may be pre-charged to VDD. For instance, two p-type transistors may be connected/coupled (e.g., electrically connected through traces, vias, etc.) to the bitlines 281 and 282 and to a voltage supply rail. For instance, a pre-charge (PCH) control signal may open the pre-charge gates (e.g., the transistors controlling pre-charging of bitlines 281 and 282). Thus, for example, to pre-charge the bitlines 281 and 282, the control signal (PCH) may be pulled low. Since the pre-charge transistors are p-type, a low control signal (PCH) on the gates may cause these transistors to be open, resulting on the bitlines 281 and 282 being set to VDD, e.g., logic high/1. When the pre-charge transistors are closed by pulling the control signal PCH on the gates high (e.g., logic high/1), the bitlines 281 and 282 may still remain at or close to VDD. Initially, the wordline 270 may be held at VSS, e.g., logic low/0. For the present example, it may be assumed that node L (221) and node R (222) store complementary logic values (e.g., logic low/0 and logic high/1, respectively). To perform a read, the wordline 270 may be turned on (logic high/1), and the pre-charge turned off, e.g., closing the gates of two p-type transistors connecting the bitlines 281 and 282 to the positive supply voltage VDD. At this point, the bitlines 281 and 282 remain charged to at or close to VDD.

For illustrative purposes, in an example in which the BTSDs 231 and 232 are not present, the following may occur during a read operation. On the right side, while the wordlines 270 is logic low/0 and therefore transistor 206 is open, node R (222) is logic high/1 and bitline 282 is also logic high/1. Accordingly, little to no current flows via the read/write transistor (pass gate) 206. However, on the left side the transistor 205 is open, bitline 281 is logic high/1, and node L (221) is logic low/0. As such, current may flow via transistor 205 and voltage on bitline 281 should start to drop. If node R (222) remains logic high/1 (which it should), the pull up active low (transistor 202) should be off, and pull down active high (transistor 201) should be on. Thus, transistor 201 may be affected by node L 221 increasing in voltage, which transistor 201 may facilitate discharging back to zero (as the bitline 281 is similarly declining from logic high/1 towards zero/VSS). In other words, the left side, node L (221) is trying to stay logic low/0. If transistor 201 is too weak or pass gate 205 is too strong, then the voltage on node L (221) may reach some intermediate value such that the right inverter (transistors 203 and 204) may turn on or partially turn on. This may further cause the output voltage at node R (222) to start to drop, which may then additionally contribute to voltage increase at node L (221) on the output of the right inverter (transistors 203 and 204). From the foregoing, it is apparent that a read operation could make the memory cell 200 unstable, potentially flipping the cell content during the read, e.g., due to process variations.

To perform a write operation, it may be preferable that the pass-gate transistors (e.g., transistors 205 and 206) are strong, while the pull-up transistors (e.g., transistors 202 and 204) are configured to assist the pass gates (e.g., transistors 205 and 206) on the writing. For illustrative purposes it may again be assumed that node L (221) is logic low/0 and node R (222) is logic high/1. To prepare data for writing (e.g., where the value to be set for node L (221) is logic high/1 and the value to be set for node R (222) is therefore low/0), bitline 281 may be set to logic high/1 and bitline 282 may be set to logic low/0. It should be noted that it may be possible to drive from only one side, but the write speed may be faster and the likelihood of success of the write operation may be higher when driven from both sides. After setting the bitlines 281 and 282, the wordline 270 may be turned on (e.g., logic high/1). In such case, the voltage at node L (221) may start to rise/increase to logic high/1. Likewise, node R (222) may start to decrease in voltage towards logic low/0 and discharge through the pass gate, transistor 206. The transistors in the inverters (e.g., transistors 201, 202, 203, and 204 may also turn on and help drive the flip in values of node L (221) and node R (222), respectively. However, if the transistors 205 and 206 are weak, or if the pull-up transistor 204 is too weak in this example, the write operation may fail to bring the memory cell 200 node R (222) to logic high/1 in time before the signal on the write line 270 goes back to logic low/0.

It should again be noted that in the absence of the BTSDs 231 and 232 of the present disclosure, noise at node L (221) can pass directly to the input of the right inverter. Similarly, noise at node R (222) can pass directly to the input of the left inverter. However, in the example memory cell 200 of FIG. 2, there are two BTSDs 231 and 232 in the inverter loop. In this case, for a read operation it is again noted that the bitlines 281 and 282 may be pre-charged to VDD, and the write line 270 may be turned on, e.g., logic high/1. If node L (221) is logic low/zero and node R (222) is logic one/high, node L (221) may start to rise from zero toward VDD when the write line 270 is turned on. However, the BTSD 232 prevents noise up to a certain voltage from passing to the input of the right inverter (e.g., the gates of transistors 203 and 204). In other words, unless the noise exceeds the protective threshold VTH, the upper feedback loop may remain unaffected/stable. This prevents amplification of the noise because it prevents or slows the feedback from kicking in. Nevertheless, the read operation can still be completed because bitline 281 will start to drop in voltage from VDD toward zero and the pull-down transistor of the lower inverter will act on the node L (221) pulling it down. A sense amplifier coupled to bitlines 281 and 282 may then start to detect the voltage difference between the bitlines 281 and 282, and may output a logic low/0 or logic high/1 depending upon when the voltage differential is positive or negative.

It should be noted that the example memory cell 200 is provided for illustrative purposes and that other, further, and different examples of the present disclosure may provide a different memory cell design. For instance, in another example, memory cell 200 may include a single BTSD. For instance, noise protection may be provided for node L (221) or node R (222). In one example, the memory cell 200 may be extended to be a multi-port memory cell, e.g., with a write port and a read/write port. For instance, memory cell 290 may represent such a design where there are two bidirectional threshold switching devices 291 in the feedback loop of two inverters 292 providing complementary storage nodes 299. A read/write port may be provided by transistors 293, which may be controlled via bitlines 294 and write line 295, while a write port may be provided by transistors 296, which may be controlled via bitlines 297 and write line 298. The principles of read noise protection provided by the example memory cell 290 may be the same as for memory cell 200. For instance, write occurs through write port(s) (transistors 296), or together through the write port(s) and the read/write port(s) (transistors 293). The BTSDs 291 are placed in series with the inverter feedback loop. Much of the read disturb noise is isolated via the BTSDs 291. Thus, these and other modifications are all contemplated within the scope of the present disclosure. In addition, it should be noted that although terms such as left, right, top, bottom, etc. are used in connection with various components of various examples of the present disclosure, such terms may be used for illustrative purposes corresponding to how such components may appear in the figures. However, in other examples, the orientations, relative positions, and so forth may be different. Thus, left and right may be similarly referred to as "first" and "second", for example, and similarly for top and bottom, and so forth.

An evaluation of the circuit design using a predictive tech model (PTM) demonstrates the effectiveness of an example memory cell, e.g., of a design such as memory cell 200 and/or memory cell 290 of FIG. 2, as compared to a similar memory cell without protective BTSDs. For instance, in one example, the threshold voltage $V_T$ for static random access memory (SRAM) transistors may be set to 0.35 V, while VDD may be set to 0.7 V. The pullup transistors (PUTs) of the inverters may be minimum sized at 60 nm, the pass-gates (PGs) may be set to 90 nm, and the pull-down (PD) transistors may be set to 110 nm for a 45 nm technology. To assess the effects of process variation, it may be assumed that node L stores a logic low/0 (and thus node R stores a logic high/1). A worst case process variation may be tested such that the left read pass gate (e.g., transistor 293 and/or transistor 205) has its threshold voltage $V_T$ made stronger, i.e., its value reduced, while the pull-down device of the lower inverter/left inverter (e.g., transistor 201 of memory cell 200) has its $V_T$ weakened, i.e., its $V_T$ is increased. Voltages at the following nodes (e.g., with reference to memory cell 290) may be set as follows: V(L)=0, V(L1)=0, V(R)=V(R1)=VDD. The left pull down may be made weaker (e.g., transistor 201 in memory cell 200, which may correspond to a counterpart component of the bottom one of inverters 292 in the memory cell 290), e.g., due to process variations, and hence may not act fast on the noise that builds up on node L (221). At the same time, the left pass gate (e.g., transistor 293 of memory cell 290, or transistor 205 of memory cell 200) may be made stronger, e.g., to reflect process variation that may inject more noise onto the memory cell 200, for purposes of read simulation. For purposes of write simulation all pass gates may be made weaker. For example, the applied shift in threshold voltage may cover the range $\Delta V_T \in \pm[0.:0.05:0.25]$ V. For simulating an example memory cell such as illustrated in FIG. 2, the BTSDs may be characterized by the following parameters: VTH=0.3, K=70, VIH=0.174 and 1 fF internal capacitance.

In accordance with such a simulation, the possibility of flipping node L during a read operation is tested (e.g., erroneously switching from logic low/0 to logic high/1). In a circuit of the present disclosure, the BTSDs help shield the inputs to the inverters from noise. When the pass-gates turn on during read, initially, node L is at a relative voltage of 0 V. The read then causes noise to be injected at node L. While the pull-down transistor of the bottom inverter discharges the noise, the left BTSD prevents the noise from propagating to the input of the top inverter. This is true until the noise accumulates above VTH with some delay across the left BTSD, which allows the discharge pull-down transistor of the bottom inverter to act on the noise. Meanwhile, if the noise propagates to the top inverter, the noise would have to build above VTH in absolute value on the other side (right BTSD) in order to disturb the input to the bottom inverter. This controls or slows the feedback, and prevents the feedback from acting on the inputs of the inverters, which also restricts the noise from amplifying in the loop. In contrast, it is observed that a comparable cell without BTSDs fails when the transistor threshold voltage adder is at $|\Delta V_T| \in [0.2, 0.25]$ V for PG/PD (pass gate/pull-down), while a memory cell such as illustrated in FIG. 2 passes these conditions.

Writability of both one-port and two-port/multi-port memory cells are similarly tested. Both perform well when subject to process variations that are designed to result in weaker pass gates for investigative purposes (e.g., a same range of threshold voltage adder as used for read simulation). It is observed that memory cells of the present disclosure and those without protective BTSDs tolerate the same or similar range of threshold voltage adder (e.g., in the worst-case direction) when relying on the write ports or both write and read/write port, with the latter being faster. It is noted that writing through the read port(s) may be possible, though limited, e.g., up to 150 mV threshold voltage adder for process variations. However, examples of the present disclosure may guard against stability failures during read and thus may further provide write assist via read port(s).

FIG. 2 further illustrates an example circuit 240 that includes a bidirectional threshold switching device (BTSD) 241 and one or more circuit components 245. For instance, BTSD may be deployed between a first port 242 (e.g., an input port) of the circuit 240 and the circuit component(s) 245. A second port 243 (e.g., an output port) of the circuit 240, is further illustrated in FIG. 2. In various examples, the one or more circuit components may include one or more of: one or more inverters, one or more nand gates, one or more nor gates, and/or one or more other logic gates, one or more transistors, e.g., where BTSD 241 is coupled to a gate, source, or drain thereof, and so forth. In one example, the circuit component(s) 245 and/or the circuit 240 may include multiple inputs, e.g., for combinational logic. In any case, the BTSD 241 may protect the circuit component port 249 from noise that may occur at port 242. For instance, this may include coupling noise, glitch originating upstream from port 242, e.g., in a different circuit or logic block that is part of the same integrated circuit as circuit 240, node upsets, read disturb, etc. In particular, the circuit component(s) 245 is/are shielded from noise at port 242 by the BTSD 241 when the noise is below the VTH of the BTSD 241. Furthermore, it should be noted that since BTSD 241 is bidirectional, external components, e.g., coupled to port 242 may be protected from noise not exceeding VTH that may originate in circuit component(s) 245 or that may be conveyed via circuit component(s) 245 to circuit component port 249. As such, the example circuit 240 illustrates that various circuit components, e.g., transistors, logic devices, logic blocks including multiple logic devices, etc. may be shielded from noise using a BTSD as described herein. To further illustrate, in one example, the circuit 240 may represent at least a portion of the example circuit 200 or the example circuit 290. For instance, in one example, the circuit 240 may represent the right BTSD 291 and lower inverter 292 of the example circuit 290. In another example, the circuit 240 may represent the left BTSD 291 and upper inverter 292 of the example circuit 290. In still another example, the circuit 240 may represent a dynamic random access memory (DRAM) cell, where the circuit components 245 may represent the input gate to the DRAM cell that is protected from noise by the BTSD 241. Thus, these and other modifications are all contemplated within the scope of the present disclosure.

Figure 3:
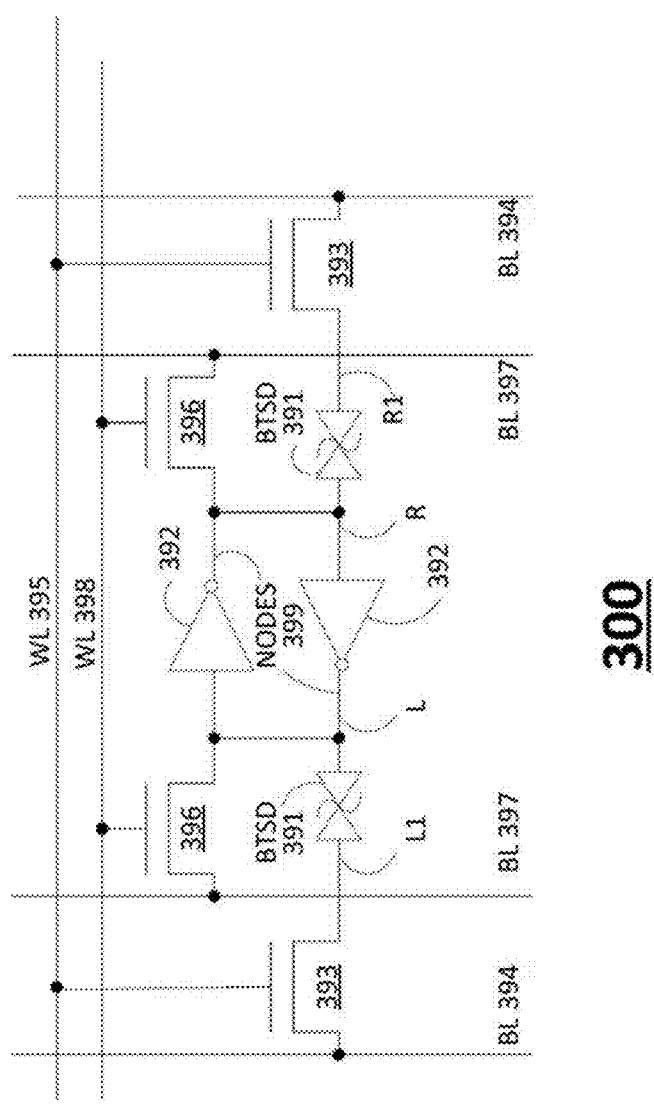
FIG. 3 illustrates an additional example memory cell including bidirectional threshold switching devices between storage nodes and read port transistors in a multi-port design, in accordance with the present disclosure.

FIG. 3 illustrates an additional example memory cell 300 of the present disclosure that includes protective BTSDs between left and right nodes (L and R) and the read port transistors in a multi-port design. For instance, the inverters 392, transistors 393, transistors 396, bitlines 394, bitlines 397, write line 395, and write line 398 may be the same or similar to corresponding components as illustrated in FIG. 2. However, in memory cell 300, the BTSDs 391 are between nodes 399 (nodes L and R) and the read port transistors 393. The write port may be provided via transistors 396, and controlled via bitlines 397 and write line 398.

As in the preceding examples, it may be assumed that node L is logic low/0 and node R is logic high/1. Accordingly, L1 between the left BTSD 391 and the left read pass gate (transistor 393) should also be logic low/0. To perform a read operation, the bitlines 394 may be pre-charged to VDD. The read port(s) (transistors 393) may then be opened (e.g., by pulling the write line 398 high, e.g., VDD, or logic high/1). With the transistors 393 open, the voltage at left bitline 394 should start to drop from VDD as current flows from the left bitline 394 across the left transistor 393. On the other hand, voltage should increase and build at L1 between the left transistor 393 and the left BTSD 391. However, the left BTSD 391 should not allow current through to node L unless the voltage differential builds higher than VTH; in this scenario, the pulldown transistor in the lower inverter turns ON and starts to discharge L1 and continues to do so even after the wordline turns OFF until the voltage across the switch drops below VIH. In the duration of a read operation and with a substantial margin of safety, this reduces the amount of noise on node L. It should be noted that a sense amplifier coupled to bitlines 394 may still see the voltage on the left bitline 394 drop, while the right bitline 394 may stay logic high, e.g., at or near VDD. As such, the sense amplifier may still read the memory cell 300 as storing a logic low/0 (e.g., where the memory is designed such that the left nodes are designated as having the stored logic value for such a memory cell 300). The left BTSD 391 still protects the input to the upper inverter from corruption.

For writability analysis, the design of memory cell 300 was tested as per the above-described setup (e.g., with the same set of assumed process variations and with the same set of transistor threshold voltages applied in a similar fashion). For a one-port write via the write port(s) only (e.g., transistors 396), node L and L1 are initially set to logic low/0. The left BL 397 is set to logic high, while the right bitline 397 is set to logic low. The write port pass-gates (transistors 396) are opened to write to the cell nodes 399 (L and R). The inverters 392 are activated and pull node L to VDD. Nodes L and R in turn drive nodes L1 and R1 via the BTSDs 391 which turn on. The BTSDs 391 turn off once the voltage(s) across the respective BTSDs 391 reaches VIH (positive or negative).

For a two-port write via both the write port and the read/write port, nodes L and L1 are initially set to logic low/0. The left BL 397 is set to logic high, while the right bitline 397 is set to logic low. Similarly, the left BL 394 is set to logic high, when the right BL 394 is set to logic low. The write port pass-gates (transistors 396) are opened to write to the cell nodes 399 (L and R). The inverters 392 are activated and pull node L to VDD. Nodes L and R in turn drive nodes L1 and R1 via the BTSDs 391 which turn on. In addition, the read/write port pass gates (transistors 393) are opened and also write to the cell nodes 399 (L and R). As such, the two-port write operation is faster than a one-port write operation. The BTSDs 391 turn off once the voltage(s) across the respective BTSDs 391 reaches VIH (positive or negative). During the write operation, using the two ports, if the pass-gate (transistor 393) is weak, the $V_t$ drop on L1 can result in the left switch turning on and L (driven also by the inverter to overcome $V_t$ drop) helps drive L1 to higher than VDD-$V_t$. When the effective pass-gate $V_t$ is relatively small, L1 and L rising at the same time do not result in the switch turning on.

In one example, aspects of the memory cell 300 of FIG. 3 may be combined with aspects of memory cell 290 of FIG. 2. For instance, BTSDs may be placed in the inverter feedback loop as well as between left and right nodes (L and R) and the read port transistors. Alternatively, a BTSD may be placed in the inverter feedback loop to protect an input of the upper inverter (e.g., between node L and the inverter input), while the right side may include a BTSD between node R and the right-side read port transistor. Thus, these and other modifications are all contemplated within the scope of the present disclosure.

FIG. 4 illustrates a flowchart of an example method 400 for preventing corruption of a stored logic value for at least one node of a memory cell via at least one bidirectional threshold switching device, e.g., where the at least one bidirectional threshold switching device is in an inverter feedback loop of the memory cell, in accordance with the present disclosure. In one example, the method 400 may be performed by a computing device or system, e.g., a processing system, or processing device, including at least one processor, a memory storing instructions, which when executed by the at least one processor, cause the processing system to perform operations, etc. For instance, the method 400 may be performed by a processing system including at least one processor, such as the computer system 700 of FIG. 7, and/or any one or more components thereof, such as processing device 702, or multiple instances of computer system 700 in communication over one or more networks and operating collectively to perform one or more aspects of the method 400. In one example, the method 400 may be performed by a circuit or a portion thereof, e.g., a memory device, e.g., a memory cell, such as memory cell 200 or 290 as described above in connection with FIG. 2 (or at least a portion thereof), which in one example may also be referred to a processor, or a processing device/system. For illustrative purposes, the method 400 is described in connection with an example performed by a memory device. The method 400 begins in 405 and may proceed to 410.

At 410, the memory device may charge a first bitline and a second bitline of a memory cell to logic high values. The memory cell may include at least a first inverter and a second inverter cross-coupled in a feedback loop, such as illustrated in FIG. 2. For instance, cross-coupling may mean that an output of one inverter feeds the input of the other inverter, either directly (e.g., electrically connected without intervening components) or indirectly (e.g., electrically connected with one or more other components, such as BTSDs, in the connection path). The memory cell may further include a first access transistor for a first node of the feedback loop and a second access transistor for a second node of the feedback loop. As described above, the first node and the second node may be for storing complementary binary data bit values. In addition, in one example, the first access transistor may be coupled to the first bitline and the first node of the feedback loop. Similarly, the second access transistor may be coupled to the second bitline and the second node of the feedback loop. The memory device may further include at least one bidirectional threshold switching device in the feedback loop between an output of the second inverter (e.g., the first node) and an input of the first inverter. The charging, e.g., pre-charging, of the first and second bitlines may be via two pre-charge transistors connected to the bitlines and VDD. For instance, in one example, the pre-charge transistors may be p-type transistors. Thus, a pre-charge (PCH) control signal may be pulled low to cause these transistors to be open, resulting in the bitlines being set to VDD, e.g., logic high/1. When the pre-charge transistors are closed by pulling the control signal PCH on the gates high (e.g., to VDD, or logic high/1), the first and second bitlines may still remain at or close to VDD.

At 420, the memory device may activate a wordline of the memory cell, to open the first access transistor and the second access transistor, e.g., n-type transistors, such as 205 and 206 of the example memory cell 200 of FIG. 2. For instance, the wordline may be pulled high (e.g., to VDD, or logic high/1) to open the first and second access transistors.

At 430, the memory device may prevent corruption of a stored logic value (e.g., a stored data bit value, which may be one of: logic high/1 or logic low/0) for the first node via the bidirectional threshold switching device, in response to the activating of the wordline. For instance, for a read operation it is again noted that the first and second bitlines may be pre-charged at 410, e.g., to VDD, and the write line may be turned on at 420, e.g., logic high/1. If the first node has a stored logic value of logic low/0 then the second node may be logic high/1. Upon activation of the wordline, the first access transistor may open, and consequently the first node may start to rise from VSS/0 V toward VDD as current flows through the first access transistor from the bitline toward the first node. However, the bidirectional threshold switching device may prevent noise up to a certain voltage from passing to the input of the first inverter. In other words, unless the noise exceeds the protective threshold VTH of the bidirectional threshold switching device, the feedback loop may remain unaffected/stable. Nevertheless, the read operation can still be completed because first bitline may still start to drop in voltage from VDD toward logic low/0, e.g., VSS.

At 440, the memory device may generate an output logic value of the memory cell (e.g., the stored logic value) in response the activating of the wordline. For instance, a sense amplifier of the memory device may be coupled to the first and second bitlines. As such, the sense amplifier may detect a voltage difference between the first and second bitlines, and may output a logic low/0 or logic high/1 depending upon when the voltage differential is positive or negative. However, in another example, a different read component may detect and output the stored logic value. For instance, a single-side read component may read the first node (or the second node), e.g., without comparison to a value of the other complementary node.

Following 440, the method 400 may proceed to 495 where the method 400 ends.

It should be noted that method 400 may be expanded to include additional steps, or may be modified to replace steps with different steps, to combine steps, to omit steps, to perform steps in a different order, and so forth. For instance, 410-440 may be performed for additional read operations, or read cycles. In one example, the method 400 may include write operations, such as charging bitlines in accordance with a value to be written to the memory cell, and turning on the wordline. In one example, the method 400 may be expanded or modified to include steps, functions, and/or operations, or other features described in connection with the example(s) of FIG. 1-3 or 5-7, or as described elsewhere herein. Thus, these and other modifications are all contemplated within the scope of the present disclosure.

In addition, in one example, the present disclosure may include a memory device, e.g., an apparatus, having a first inverter and a second inverter cross-coupled in a feedback loop, such as illustrated in FIG. 2. The memory cell may further include a first access transistor for a first node of the feedback loop and a second access transistor for a second node of the feedback loop. As described above, the first node and the second node may be for storing complementary binary data bit values. The memory device may further include at least one bidirectional threshold switching device in the feedback loop between an output of the second inverter (e.g., the first node) and an input of the first inverter. In this regard, it should be noted that an output of the second inverter may be the first node, while an output of the first inverter may be the second node. In one example, the memory device may be a static random access memory cell.

In one example, the memory device may further include two transistors for pre-charging the first and second bitlines respectively. For instance, in one example, the pre-charge transistors may be p-type transistors. In one example, the pre-charge transistors may be connected to the bitlines and to a positive supply voltage, e.g., VDD. In one example, the first inverter may include a first pull-up transistor and a first pull-down transistor. Similarly, the second inverter may include a second pull-up transistor and a second pull-down transistor. In addition, the memory device may include a wordline. For instance, a first gate of the first access transistor and a second gate of the second access transistor may be connected to and controlled via the wordline.

The memory device may further include a first bitline and a second bitline. In one example, the first access transistor may be connected to the first bitline and the first node of the feedback loop. Similarly, the second access transistor may be connected to the second bitline and the second node of the feedback loop. It should be noted that for a write operation, the second bitline may convey inverse signals from the first bitline. However, for a read operation, both bitlines may be precharged to logic high/1, e.g., VDD.

In addition, in one example, the memory device may include a sense amplifier coupled to the first bitline and to the second bitline, where the sense amplifier is for a read operation. In one example, the memory device may further include a second bidirectional threshold switching device in the feedback loop between an output of the first inverter and an input of the second inverter. In one example, the memory device may be a multi-port static random access memory cell. In addition, in such an example, the memory device may further include: a second wordline, a third access transistor, a fourth access transistor, a third bitline, and a fourth bitline. For instance, the memory device may be a multi-port static random access memory cell such as memory cell 290 of FIG. 2.

In one example, the bidirectional threshold switching device may include a silver and oxide-based structure, e.g., hafnia, hafnium oxide, or hafnium oxide polymorphs (e.g., $HfO_x$), where x varies depending on the polymorph (e.g., x=2, 0.7, 1.7, etc.). In another example, a different metal besides silver (Ag) may be utilized, such as copper (Cu), etc. Accordingly, in one example, the bidirectional threshold switching device may include a metal and hafnium oxide-based structure. In one example, the bidirectional threshold switching device may be configured with a positive threshold voltage to turn on, a positive hold voltage to turn off, a negative threshold voltage to turn on, and a negative hold voltage to turn off. For instance, "on" may be considered a current greater than $10^{-6}$ A, while "off" may be considered a current less than $10^{-10}$ A, or the like. In one example, the positive threshold voltage and the negative threshold voltage may be symmetric, and likewise for the positive hold voltage and the negative hold voltage. In one example, the positive threshold voltage may be greater than a transistor threshold voltage of a first pull-down transistor of the first inverter and/or of a transistor threshold voltage of a second pull-down transistor of the second inverter (which in one example may be the same transistor threshold voltage as that of the first pull-down transistor of the first inverter). In one example, the foregoing apparatus(es) may represent a processing system, such as a memory device, performing the example method 400 of FIG. 4 and/or may be used in connection with any one or more aspects of the method 400.

FIG. 5 illustrates a flowchart of an example method 500 for preventing corruption of a stored logic value for at least one node of a memory cell via at least one bidirectional threshold switching device, e.g., where the at least one bidirectional threshold switching device is between a first access transistor and a first node of the memory cell. In one example, the method 500 may be performed by a computing device or system, e.g., a processing system, or processing device, including at least one processor, a memory storing instructions, which when executed by the at least one processor, cause the processing system to perform operations, etc. For instance, the method 500 may be performed by a processing system including at least one processor, such as the computer system 700 of FIG. 7, and/or any one or more components thereof, such as processing device 702, or multiple instances of computer system 700 in communication over one or more networks and operating collectively to perform one or more aspects of the method 500. In one example, the method 500 may be performed by a circuit or a portion thereof, e.g., a memory device, e.g., a memory cell, such as memory cell 300 as described above in connection with FIG. 3 (or at least a portion thereof), which in one example may also be referred to a processor, or a processing device/system. For illustrative purposes, the method 500 is described in connection with an example performed by a memory device. The method 500 begins in 505 and may proceed to 510.

At 510, the memory device may charge a first bitline and a second bitline of a memory cell to logic high values. The memory cell may include at least a first inverter and a second inverter cross-coupled in a feedback loop, such as illustrated in FIG. 3. The memory cell may further include a first access transistor for a first node of the feedback loop and a second access transistor for a second node of the feedback loop. As described above, the first node and the second node may be for storing complementary binary data bit values. In addition, in one example, the first access transistor may be coupled to the first bitline and the first node of the feedback loop. Similarly, the second access transistor may be coupled to the second bitline and the second node of the feedback loop. The memory device may further include at least one bidirectional threshold switching device between the first access transistor and the first node, where the first access transistor is coupled to the first bitline and the bidirectional threshold switching device. In one example, the charging, e.g., pre-charging, of the first and second bitlines may be via two pre-charge transistors connected to the bitlines and a positive supply voltage, e.g., VDD, such as described above in connection with 410 of the example method 400 of FIG. 4.

At 520, the memory device may activate a wordline of the memory cell, to open the first access transistor and the second access transistor, e.g., n-type transistors, such as transistors 393 of the example memory cell 300 of FIG. 3. For instance, the wordline may be pulled high to open the first and second access transistors. In one example, 520 may comprise the same or similar operations as 420 of the example method 400 of FIG. 4.

At 530, the memory device may prevent a voltage change for the first node via the bidirectional threshold switching device, in response to the activating of the wordline. For instance, for a read operation it is again noted that the first and second bitlines may be pre-charged at 510, e.g., to VDD, and the write line may be turned on at 520, e.g., to VDD, or logic high/1. If the first node is logic low/0 then the second node may be logic high/1. Accordingly, between the bidirectional threshold switching device and the first access transistor (such as the left read pass gate, transistor 393 on the left side of the example memory cell 300 of FIG. 3) should also be logic low/0. With the first access transistor open, the voltage on the first bitline should start to drop from VDD as current flows from the first bitline across the first access transistor. On the other hand, voltage should increase and build between the first access transistor and the bidirectional threshold switching device. However, the bidirectional threshold switching device should not allow current through unless the voltage differential builds higher than VTH. If this occurs, the pull-down transistor of the first inverter (e.g., the lower inverter 392 in FIG. 2) may activate/ turn on and start to discharge the first node, and may continue to do so even after the wordline turns off (and until the voltage across the bidirectional threshold switching device drops below VIH). In the duration of a read operation and with a substantial margin of safety, this may reduce the noise reaching the first node.

At 540, the memory device may generate an output logic value of the memory cell (e.g., the stored logic value) in response the activating of the wordline. For instance, a sense amplifier of the memory device may be coupled to the first and second bitlines. As such, the sense amplifier may detect a voltage difference between the first and second bitlines, and may output a logic low/0 or logic high/1 depending upon when the voltage differential is positive or negative. However, in another example, a different read component may detect and output the stored logic value. For instance, a single-side read component may read the first node (or the second node), e.g., without comparison to a value of the other complementary node. In one example, 540 may comprise the same or similar operations as 440 of the example method 400 of FIG. 4.

Following 540, the method 500 may proceed to 595 where the method 500 ends.

It should be noted that method 500 may be expanded to include additional steps, or may be modified to replace steps with different steps, to combine steps, to omit steps, to perform steps in a different order, and so forth. For instance, 510-540 may be performed for additional read operations, or read cycles. In one example, the method 500 may include write operations, such as charging bitlines in accordance with a value to be written to the memory cell, and turning on the wordline. In one example, the method 500 may be expanded or modified to include steps, functions, and/or operations, or other features described in connection with the example(s) of FIG. 1-4, 6, or 7, or as described elsewhere herein. Thus, these and other modifications are all contemplated within the scope of the present disclosure.

In addition, in one example, the present disclosure may include a memory device, e.g., an apparatus, having a first inverter and a second inverter cross-coupled in a feedback loop, such as illustrated in FIG. 3. The memory cell may further include a first access transistor for a first node of the feedback loop and a second access transistor for a second node of the feedback loop. As described above, the first node and the second node may be for storing complementary binary data bit values. The memory device may further include at least one bidirectional threshold switching device between the first access transistor and the first node. In one example, the first access transistor may be coupled to a first bitline and the bidirectional threshold switching device. In one example, the memory device may be a static random access memory cell. In addition, the memory device may include a wordline. For instance, a first gate of the first access transistor and a second gate of the second access transistor may be connected to and controlled via the wordline.

In one example, the first access transistor may be a first read port access transistor, and the second access transistor may be a second read port access transistor. In addition, the wordline may be a first wordline. In addition, the memory device may further include a first bitline and a second bitline, where the first read port access transistor is coupled to the first bitline, and where the second read port access transistor is coupled to the second bitline. In one example, the memory device may further include a first write port access transistor for the first node of the feedback loop, a second write port access transistor for the second node of the feedback loop, and a second word line. In such an example, a first gate of the first write port access transistor and a second gate of the second write port access transistor may be controlled by the second word line.

In one example, the memory device may further include two transistors for pre-charging first and second bitlines respectively. For instance, in one example, the pre-charge transistors may be p-type transistors. In one example, the pre-charge transistors may be connected to the bitlines and VDD. In one example, the first inverter may include a first pull-up transistor and a first pull-down transistor. Similarly, the second inverter may include a second pull-up transistor and a second pull-down transistor. It should be noted that for a write operation, the second bitline may convey inverse signals from the first bitline. However, for a read operation, both bitlines may be precharged to logic high/1, e.g., VDD.

In addition, in one example, the memory device may include a sense amplifier coupled to the first bitline and to the second bitline, where the sense amplifier is for a read operation. In one example, the memory device may further include a second bidirectional threshold switching device between the second access transistor and the second node. In one example, the memory device may be a multi-port static random access memory cell. In addition, in such an example, the memory device may further include: a second wordline, a third access transistor, a fourth access transistor, a third bitline, and a fourth bitline. For instance, the memory device may be a multi-port static random access memory cell such as memory cell 300 of FIG. 3.

In one example, the bidirectional threshold switching device may include a silver and oxide-based structure, e.g., hafnia, hafnium oxide, or hafnium oxide polymorphs (e.g., $HfO_x$), where x varies depending on the polymorph (e.g., x=2, 0.7, 1.7, etc.). In another example, a different metal besides silver (Ag) may be utilized, such as copper (Cu), etc. Accordingly, in one example, the bidirectional threshold switching device may include a metal and hafnium oxide-based structure. In one example, the bidirectional threshold switching device may be configured with a positive threshold voltage to turn on, a positive hold voltage to turn off, a negative threshold voltage to turn on, and a negative hold voltage to turn off. For instance, "on" may be considered a current greater than $10^{-6}$ A, while "off" may be considered a current less than $10^{-10}$ A, or the like. In one example, the positive threshold voltage and the negative threshold voltage may be symmetric, and likewise for the positive hold voltage and the negative hold voltage. In one example, the positive threshold voltage may be greater than a transistor threshold voltage of a first pull-down transistor of the first inverter and/or of a transistor threshold voltage of a second pull-down transistor of the second inverter (which in one example may be the same transistor threshold voltage as that of the first pull-down transistor of the first inverter). In one example, the foregoing apparatus(es) may represent a processing system, such as a memory device, performing the example method 500 of FIG. 5 and/or may be used in connection with any one or more aspects of the method 500.

In addition, in one example, the present disclosure may include a circuit, e.g., an apparatus, such as the circuit 240 of FIG. 2, having at least one logic component and a bidirectional threshold switching device coupled to the at least one logic component to shield the at least one logic component from noise external to the at least one logic component. In one example, the bidirectional threshold switching device may be configured with a positive threshold voltage to turn on, a positive hold voltage to turn off, a negative threshold voltage to turn on, and a negative hold voltage to turn off. In addition, in one example, the positive threshold voltage to turn on may be an intermediate voltage between a logic high voltage and a logic low voltage of the circuit. In one example, the foregoing circuit may be used in connection with any one or more aspects of the example method 400 of FIG. 4 or the example method 500 of FIG. 5.

Figure 6:
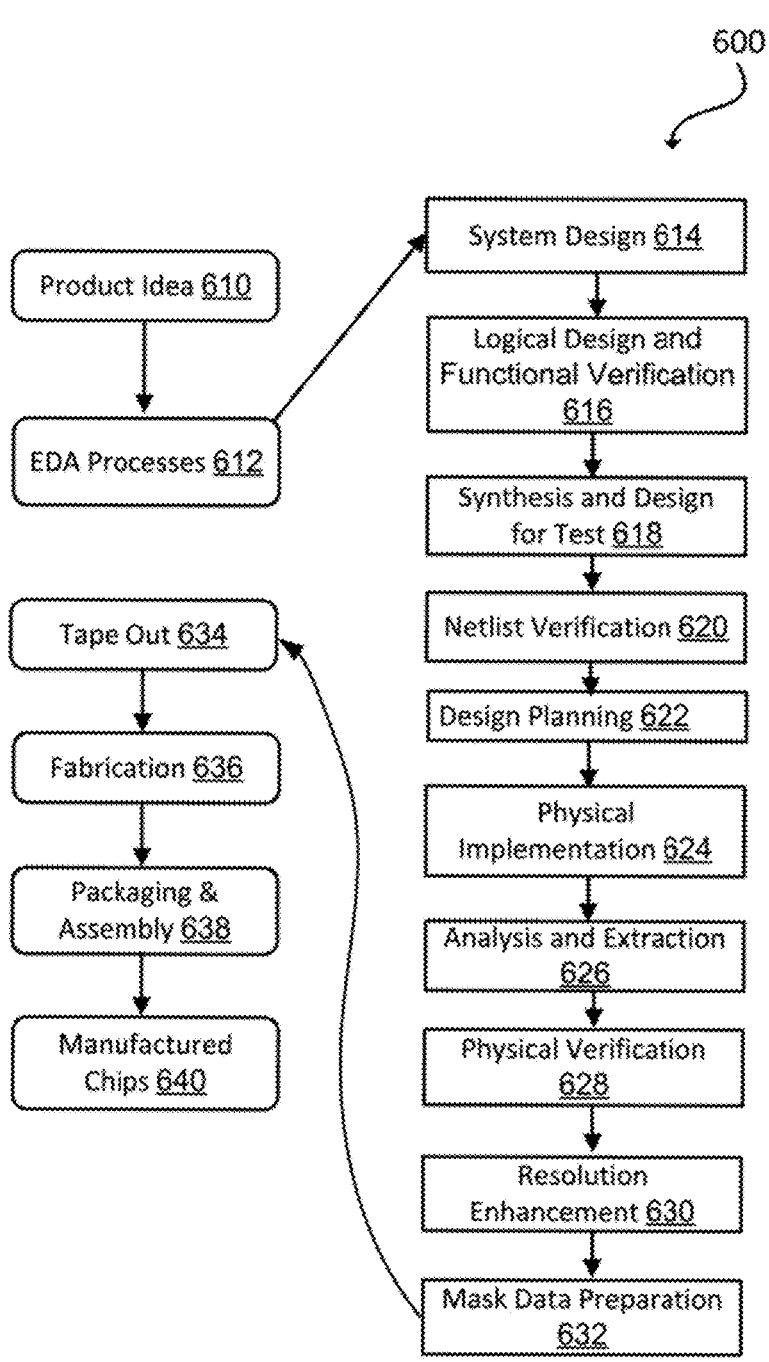
FIG. 6 illustrates a flowchart of various processes used during the design and manufacture of an integrated circuit in accordance with some embodiments of the present disclosure.

FIG. 6 illustrates an example set of processes 600 used during the design, verification, and fabrication of an article of manufacture such as an integrated circuit to transform and verify design data and instructions that represent the integrated circuit. Each of these processes can be structured and enabled as multiple modules or operations. The term 'EDA' signifies the term 'Electronic Design Automation.' These processes start with the creation of a product idea 610 with information supplied by a designer, information which is transformed to create an article of manufacture that uses a set of EDA processes 612. When the design is finalized, the design is taped-out 634, which is when artwork (e.g., geometric patterns) for the integrated circuit is sent to a fabrication facility to manufacture the mask set, which is then used to manufacture the integrated circuit. After tape-out, a semiconductor die is fabricated 636 and packaging and assembly processes 638 are performed to produce the finished integrated circuit 640.

Specifications for a circuit or electronic structure may range from low-level transistor material layouts to high-level description languages. A high-level of representation may be used to design circuits and systems, using a hardware description language ('HDL') such as VHDL, Verilog, System Verilog, SystemC, MyHDL or Open Vera. The HDL description can be transformed to a logic-level register transfer level ('RTL') description, a gate-level description, a layout-level description, or a mask-level description. Each lower representation level that is a more detailed description adds more useful details into the design description, for example, more details for the modules that include the description. The lower levels of representation that are more detailed descriptions can be generated by a computer, derived from a design library, or created by another design automation process. An example of a specification language at a lower level of representation language for specifying more detailed descriptions is SPICE, which is used for detailed descriptions of circuits with many analog components. Descriptions at each level of representation are enabled for use by the corresponding systems of that layer (e.g., a formal verification system). A design process may use a sequence depicted in FIG. 6. The described processes may be enabled by EDA products (or EDA systems).

During system design 614, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 616, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification.

During synthesis and design for test 618, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 620, the netlist is checked for compliance with timing constraints and for correspondence with the HDL code. During design planning 622, an overall floor plan for the integrated circuit is constructed and analyzed for timing and top-level routing.

During layout or physical implementation 624, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 626, the circuit function is verified at the layout level, which permits refinement of the layout design. During physical verification 628, the layout design is checked to ensure that manufacturing constraints are correct, such as DRC constraints, electrical constraints, lithographic constraints, and that circuitry function matches the HDL design specification. During resolution enhancement 630, the geometry of the layout is transformed to improve how the circuit design is manufactured.

During tape-out, data is created to be used (after lithographic enhancements are applied if appropriate) for production of lithography masks. During mask data preparation 632, the 'tape-out' data is used to produce lithography masks that are used to produce finished integrated circuits.

A storage subsystem of a computer system (such as computer system 700 of FIG. 7) may be used to store the programs and data structures that are used by some or all of the EDA products described herein, and products used for development of cells for the library and for physical and logical design that use the library.

Figure 7:
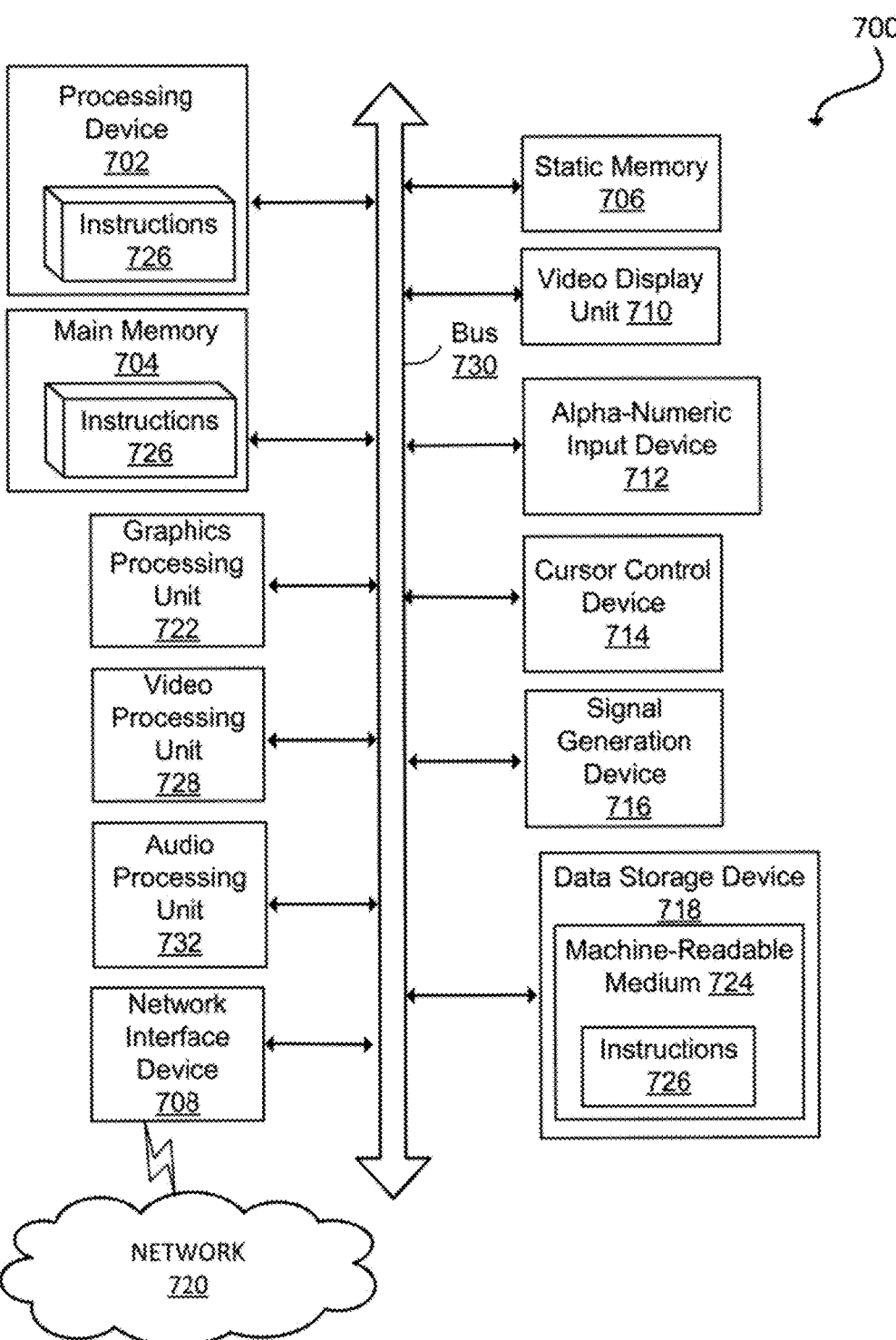
FIG. 7 illustrates a diagram of an example computer system in which embodiments of the present disclosure may operate.

FIG. 7 illustrates an example machine of a computer system 700 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 700 includes a processing device 702, a main memory 704 (e.g., read-only memory (ROM), flash memory, dynamic random access memory (DRAM) such as synchronous DRAM (SDRAM), a static memory 706 (e.g., flash memory, static random access memory (SRAM), etc.), and a data storage device 718, which communicate with each other via a bus 730.

Processing device 702 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 702 may also be one or more special-purpose processing devices such as an application specific integrated circuit (ASIC), a field programmable gate array (FPGA), a digital signal processor (DSP), network processor, or the like. The processing device 702 may be configured to execute instructions 726 for performing the operations and steps described herein.

The computer system 700 may further include a network interface device 708 to communicate over the network 720. The computer system 700 also may include a video display unit 710 (e.g., a liquid crystal display (LCD) or a cathode ray tube (CRT)), an alphanumeric input device 712 (e.g., a keyboard), a cursor control device 714 (e.g., a mouse), a graphics processing unit 722, a signal generation device 716 (e.g., a speaker), graphics processing unit 722, video processing unit 728, and audio processing unit 732.

The data storage device 718 may include a machine-readable storage medium 724 (also known as a non-transitory computer-readable medium) on which is stored one or more sets of instructions 726 or software embodying any one or more of the methodologies or functions described herein. The instructions 726 may also reside, completely or at least partially, within the main memory 704 and/or within the processing device 702 during execution thereof by the computer system 700, the main memory 704 and the processing device 702 also constituting machine-readable storage media.

In some implementations, the instructions 726 include instructions to implement functionality corresponding to the present disclosure. While the machine-readable storage medium 724 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 702 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each connected to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The present disclosure and drawings are, accordingly, to be regarded in an illustrative sense rather than a restrictive sense.

What is claimed is:

1. A memory device comprising:
a first inverter;
a second inverter, wherein the first inverter and the second inverter are cross-coupled in a feedback loop;
a first access transistor for a first node of the feedback loop;
a second access transistor for a second node of the feedback loop, wherein the first node and the second node are to store complementary binary data bit values; and
a bidirectional threshold switching device in the feedback loop between an output of the second inverter and an input of the first inverter.

2. The memory device of claim 1, wherein the first inverter comprises: a first pull-up transistor and a first pull-down transistor, and wherein the second inverter comprises: a second pull-up transistor and a second pull-down transistor.

3. The memory device of claim 1, further comprising:
a wordline, wherein a first gate of the first access transistor and a second gate of the second access transistor are controlled via the wordline.

4. The memory device of claim 1, further comprising:
a first bitline; and
a second bitline, wherein the first access transistor is coupled to the first bitline and the first node of the feedback loop, and wherein the second access transistor is coupled to the second bitline and the second node of the feedback loop.

5. The memory device of claim 4, wherein for a write operation, the second bitline conveys an inverse signal from the first bitline.

6. The memory device of claim 4, further comprising:
a sense amplifier coupled to the first bitline and to the second bitline, wherein the sense amplifier is for a read operation.

7. The memory device of claim 1, wherein the bidirectional threshold switching device comprises a silver and oxide-based structure.

8. The memory device of claim 1, wherein the bidirectional threshold switching device comprises a metal and hafnium oxide-based structure.

9. The memory device of claim 1, wherein the bidirectional threshold switching device is configured with a positive threshold voltage to turn on, a positive hold voltage to turn off, a negative threshold voltage to turn on, and a negative hold voltage to turn off.

10. The memory device of claim 9, wherein the positive threshold voltage and the negative threshold voltage are symmetric, and where the positive hold voltage and the negative hold voltage are symmetric.

11. The memory device of claim 9, wherein the positive threshold voltage is greater than a transistor threshold voltage of a first pull-down transistor of the first inverter.

12. The memory device of claim 1, wherein the memory device comprises a static random access memory cell.

13. The memory device of claim 1, wherein the memory device comprises a multi-port static random access memory cell.

14. The memory device of claim 1, further comprising:
a second bidirectional threshold switching device in the feedback loop between an output of the first inverter and an input of the second inverter.

15. A method comprising:
charging a first bitline and a second bitline of a memory cell to logic high values, the memory cell comprising:
a first inverter;
a second inverter, wherein the first inverter and the second inverter are cross-coupled in a feedback loop;
a first access transistor for a first node of the feedback loop;
a second access transistor for a second node of the feedback loop, wherein the first node and the second node are to store complementary binary data bit values, wherein the first access transistor is coupled to the first bitline and the first node of the feedback loop, and wherein the second access transistor is coupled to the second bitline and the second node of the feedback loop; and a bidirectional threshold switching device in the feed-
  back loop between an output of the second inverter
  and an input of the first inverter; and
activating a wordline of the memory cell, to open the first
  access transistor and the second access transistor;
preventing a voltage change for the first node via the
  bidirectional threshold switching device, in response to
  the activating of the wordline; and
generating an output value of the memory cell in response
  the activating of the wordline.

16. A memory device comprising:
a first inverter;
a second inverter, wherein the first inverter and the second
  inverter are cross-coupled in a feedback loop;
a first access transistor for a first node of the feedback
  loop;
a second access transistor for a second node of the
  feedback loop, wherein the first node and the second
  node are to store complementary binary data bit values;
a wordline, wherein a first gate of the first access tran-
  sistor and a second gate of the second access transistor
  are controlled by the wordline; and
a first bidirectional threshold switching device between
  the first access transistor and the first node.

17. The memory device of claim 16, further comprising:
a second bidirectional threshold switching device
  between the second access transistor and the second
  node.

18. The memory device of claim 16, wherein the first
access transistor comprises a first read port access transistor,
wherein the second access transistor comprises a second
read port access transistor, wherein the wordline comprises
a first wordline, and wherein the memory device further
comprises:
  a first bitline;
  a second bitline, wherein the first read port access tran-
    sistor is coupled to the first bitline, and wherein the
    second read port access transistor is coupled to the
    second bitline;
  a first write port access transistor for the first node of the
    feedback loop;
  a second write port access transistor for the second node
    of the feedback loop; and
  a second wordline, wherein a first gate of the first write
    port access transistor and a second gate of the second
    write port access transistor are controlled by the second
    wordline.

19. The memory device of claim 16, wherein the first
bidirectional threshold switching device is configured with a
positive threshold voltage to turn on, a positive hold voltage
to turn off, a negative threshold voltage to turn on, and a
negative hold voltage to turn off.

\* \* \* \* \*